(12) United States Patent
Peng et al.

(10) Patent No.: US 11,710,665 B2
(45) Date of Patent: Jul. 25, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chun-Yen Peng, Hsinchu (TW); Te-Yang Lai, Hsinchu (TW); Sai-Hooi Yeong, Zhubei (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 10 days.

(21) Appl. No.: 17/403,263

(22) Filed: Aug. 16, 2021

(65) Prior Publication Data
US 2021/0375690 A1    Dec. 2, 2021

Related U.S. Application Data

(63) Continuation of application No. 16/549,536, filed on Aug. 23, 2019, now Pat. No. 11,101,180.

(51) Int. Cl.
| | |
|---|---|
| *H01L 21/8234* | (2006.01) |
| *H01L 21/28* | (2006.01) |
| *H01L 29/66* | (2006.01) |
| *H01L 29/51* | (2006.01) |
| *H01L 21/02* | (2006.01) |
| *H01L 29/78* | (2006.01) |
| *H01L 21/3115* | (2006.01) |

(52) U.S. Cl.
CPC ........ *H01L 21/823462* (2013.01); *H01L 21/02356* (2013.01); *H01L 21/28158* (2013.01); *H01L 21/28185* (2013.01); *H01L 21/3115* (2013.01); *H01L 21/823431* (2013.01); *H01L 29/517* (2013.01); *H01L 29/66795* (2013.01); *H01L 29/785* (2013.01)

(58) Field of Classification Search
CPC ......... H01L 21/02356; H01L 21/28158; H01L 21/28185; H01L 21/3115; H01L 21/823431; H01L 21/823462; H01L 29/517; H01L 29/66795; H01L 29/785; H01L 29/7851; B82Y 30/00; B82Y 40/00
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |

(Continued)

*Primary Examiner* — Cheung Lee
(74) *Attorney, Agent, or Firm* — Slater Matsil, LLP

(57) ABSTRACT

A nano-crystalline high-k film and methods of forming the same in a semiconductor device are disclosed herein. The nano-crystalline high-k film may be initially deposited as an amorphous matrix layer of dielectric material and self-contained nano-crystallite regions may be formed within and suspended in the amorphous matrix layer. As such, the amorphous matrix layer material separates the self-contained nano-crystallite regions from one another preventing grain boundaries from forming as leakage and/or oxidant paths within the dielectric layer. Dopants may be implanted in the dielectric material and crystal phase of the self-contained nano-crystallite regions maybe modified to change one or more of the permittivity of the high-k dielectric material and/or a ferroelectric property of the dielectric material.

20 Claims, 12 Drawing Sheets

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2006/0157741 | A1 | 7/2006 | Jin |
| 2008/0146012 | A1 | 6/2008 | Lin et al. |
| 2011/0068407 | A1 | 3/2011 | Yeh et al. |
| 2019/0067488 | A1 | 2/2019 | Tsai et al. |

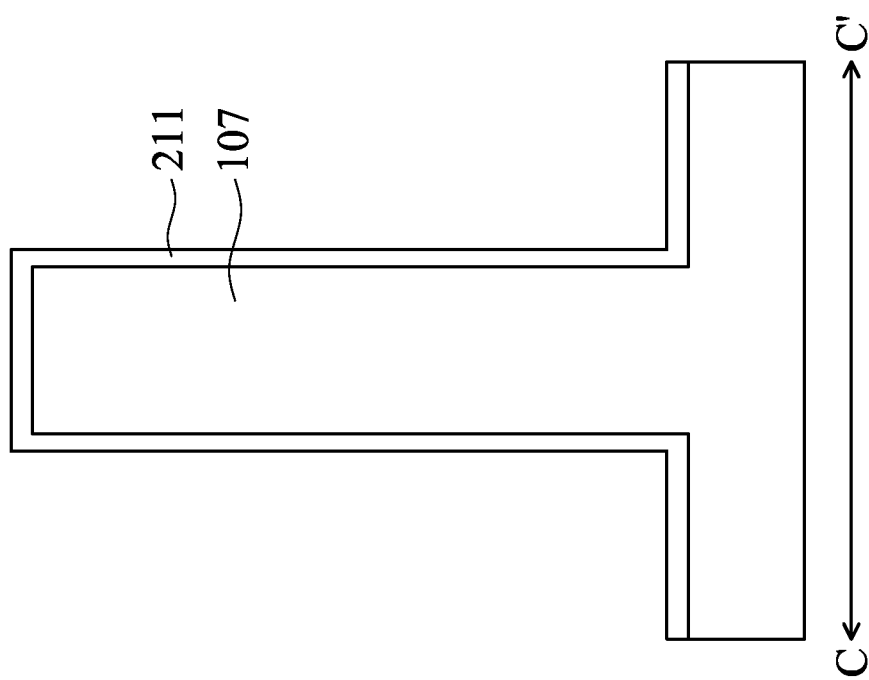

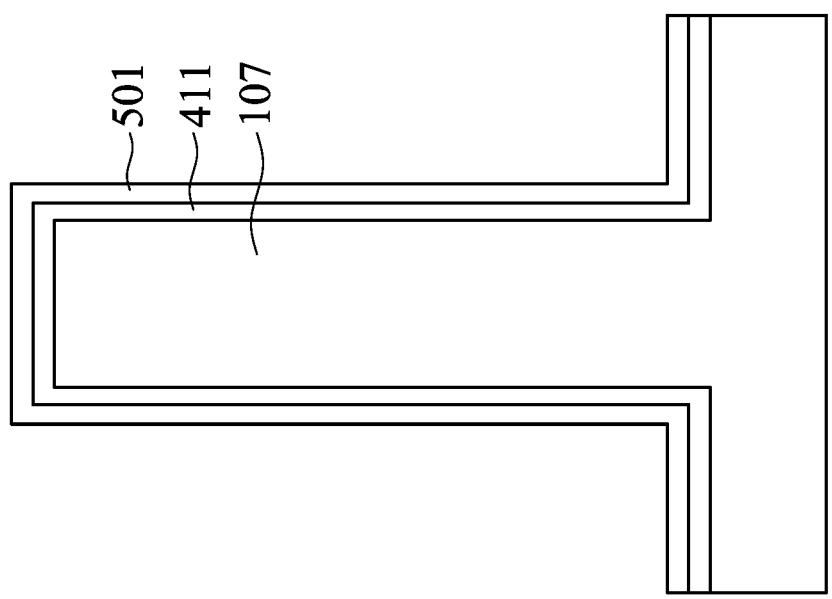

SEMICONDUCTOR DEVICE AND METHOD OF MANUFACTURE

PRIORITY CLAIM AND CROSS-REFERENCE

This patent is a continuation of U.S. application Ser. No. 16/549,536, filed on Aug. 23, 2019, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrate, in three related views, formation of a first dielectric layer in accordance with some embodiments.

FIG. 5 illustrates formation of a capping layer in accordance with some embodiments.

DETAILED DESCRIPTION

Figure 1:
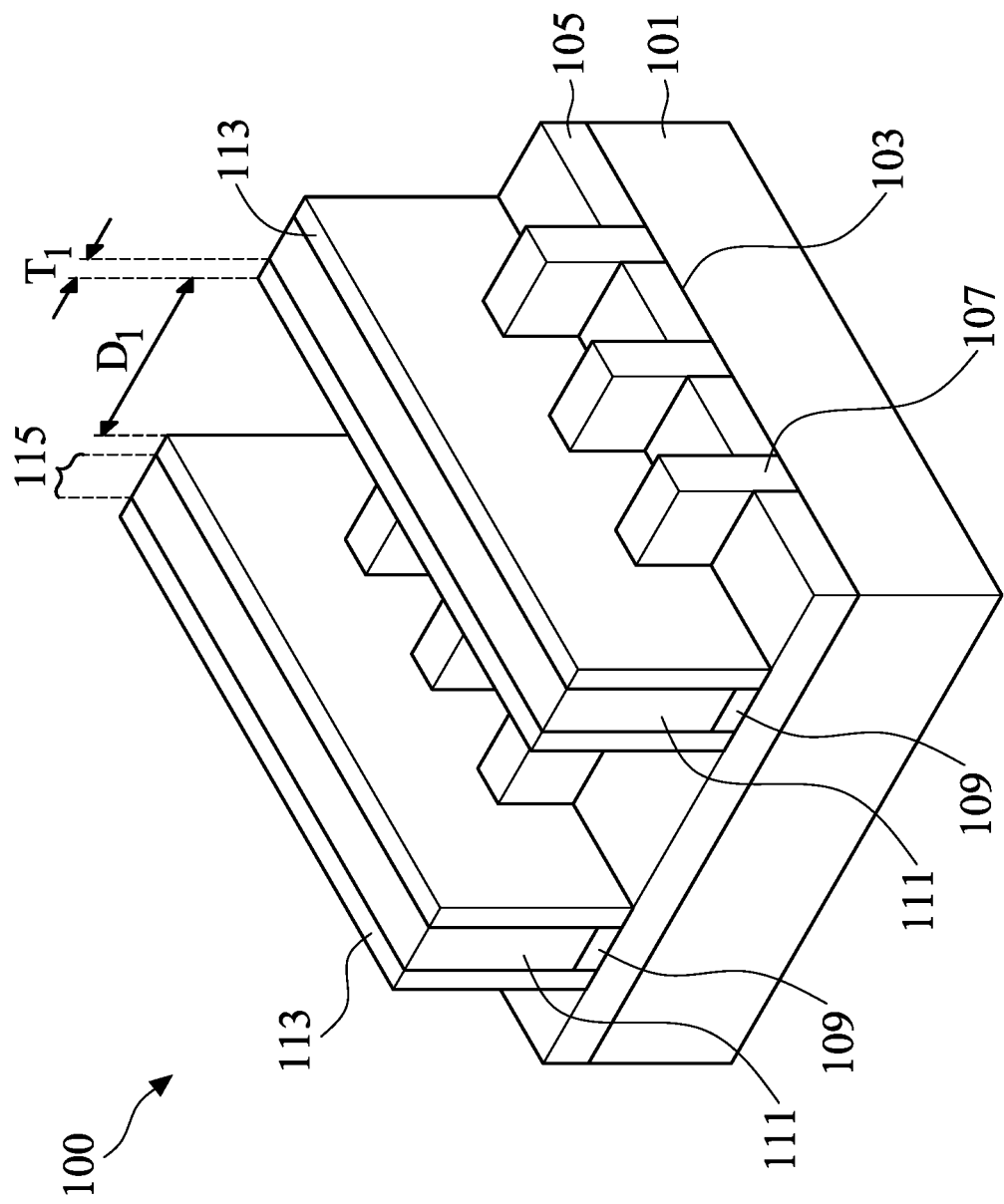
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a finFET device. In an embodiment the finFET device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally form fins 107 from those portions of the substrate 101 that remain unremoved. For convenience the fins 107 have been illustrated in the figures as being separate from the substrate 101 by a dashed line and by a different pattern, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, dummy gate dielectrics 109, dummy gate electrodes 111 over the dummy gate dielectrics 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrodes 111 may comprise a conductive material and may be selected from a group comprising of W, Al, Cu, AlCu, Ti, TiAlN, TaC, TaCN, TaSiN, Mn, Zr, TiN, Ta, TaN, Co, Ni, combinations of these, or the like. The dummy gate electrodes 111 may be deposited by chemical vapor deposition (CVD), sputter deposition, or other techniques known and used in the art for depositing conductive materials. The thickness of the dummy gate electrodes 111 may be in the range of about 5 Å to about 200 Å. The top surface of the dummy gate electrodes 111 may have a non-planar top surface, and may be planarized prior to patterning of the dummy gate electrodes 111 or gate etch. Ions may or may not be introduced into the dummy gate electrodes 111 at this point. Ions may be introduced, for example, by ion implantation techniques.

Once formed, the dummy gate dielectric 109 and the dummy gate electrodes 111 may be patterned to form a series of dummy stacks 115 over the fins 107. The dummy stacks 115 define multiple channel regions located on each side of the fins 107 beneath the dummy gate dielectric 109. The dummy stacks 115 may be formed by depositing and patterning a gate mask (not separately illustrated in FIG. 1) on the dummy gate electrodes 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrodes 111 and the dummy gate dielectric 109 may be etched using a dry etching process to form the patterned dummy stacks 115.

Once the dummy stacks 115 have been patterned, the first spacers 113 may be formed. The first spacers 113 may be formed on opposing sides of the dummy stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 5 Å and about 500 Å, such as about 50 Å. Additionally, once the first spacers 113 have been formed, a first spacer 113 adjacent to one stack 115 may be separated from a first spacer 113 adjacent to another stack 115 by a first distance $D_1$ of between about 5 nm and about 200 nm, such as about 20 nm. However, any suitable thicknesses and distances may be utilized.

Figure 2:
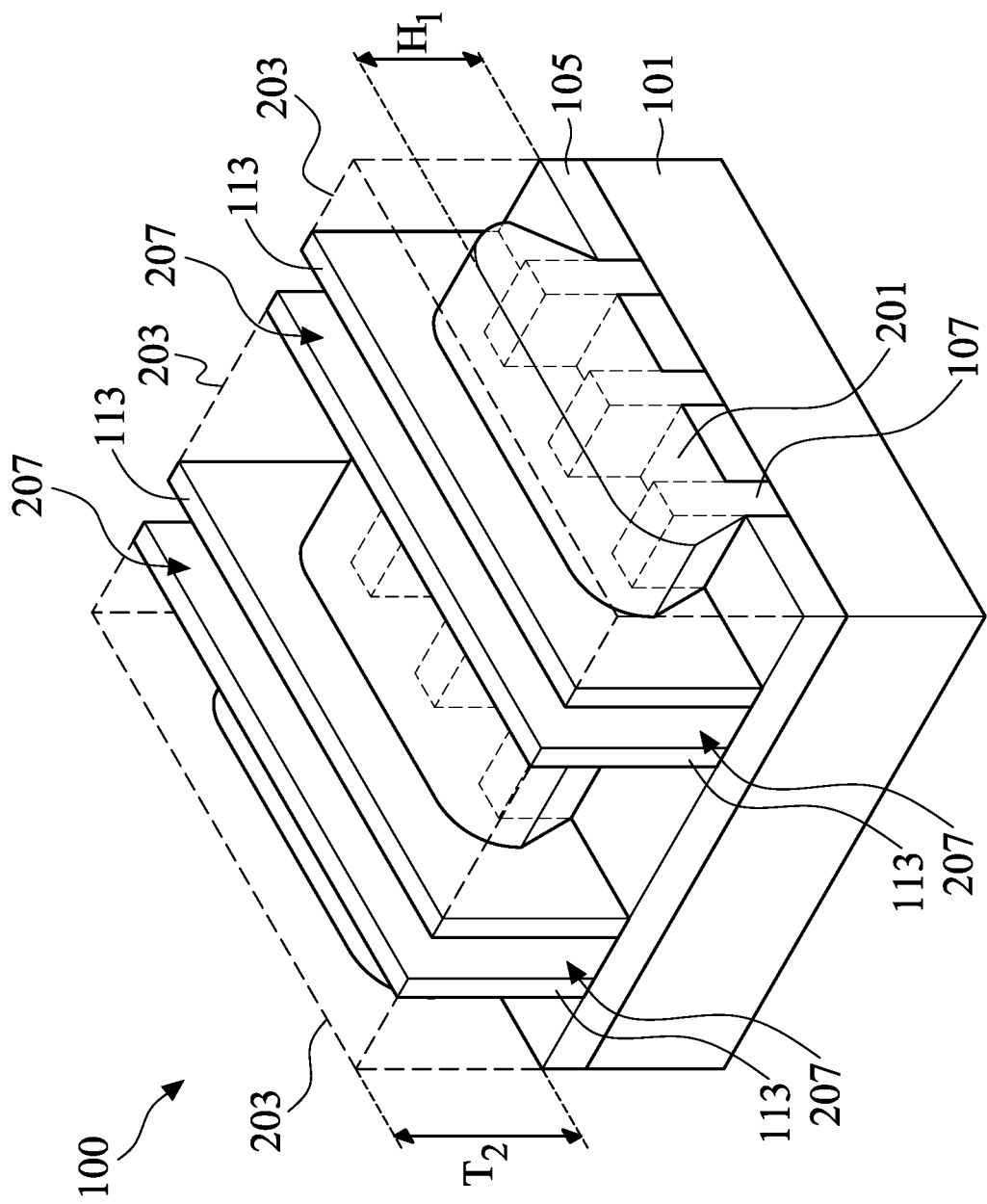
FIG. 2 illustrates formation of source/drain regions and formation of an interlayer dielectric (ILD) layer in accordance with some embodiments.

FIG. 2 illustrates a formation of source/drain regions 201 of the semiconductor device 100. FIG. 2 further illustrates a removal of the dummy stacks 115 to form openings 207 between the first spacers 113 and to expose the fins 107 within channel regions of the semiconductor device 100 for further processing to be performed.

According to some embodiments, those portions of the fins 107 in areas not protected by the dummy stacks 115 and not protected by the first spacers 113, as illustrated in FIG. 1, are removed. Once those portions of the fins 107 are removed, source/drain regions 201 are regrown. The removal of the fins 107 from those areas not protected by the dummy stacks 115 and not protected by the first spacers 113 may be performed by a reactive ion etch (RIE) using the dummy stacks 115 and the first spacers 113 as hardmasks, or by any other suitable removal process. The removal may be continued until the fins 107 are either planar with or below the surface of the first isolation regions 105.

Once these portions of the fins 107 have been removed, a hard mask is placed and patterned to cover the dummy gate electrodes 111 to prevent growth and the source/drain regions 201 may be regrown in contact with each of the fins 107 in the channel regions located underneath the dummy stacks 115. In an embodiment the source/drain regions 201 may be regrown and, in some embodiments the source/drain regions 201 may be regrown to form a stressor that will impart a stress to the channel regions of the fins 107 located underneath the dummy stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. In other embodiments the source/drain regions 201 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å, and may have a first height H1 over the first isolation regions 105 of between about 10 Å and about 500 Å, such as about 200 Å. However, any suitable height may be utilized.

Once the source/drain regions 201 are formed, dopants may be implanted into the source/drain regions 201 by implanting appropriate dopants to complement the dopants in the fins 107 in the channel regions located underneath the dummy stacks 115. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrodes 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the dummy stacks 115 and over the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness $T_2$ of between about 100 Å and about 3,000 Å. Once formed, the ILD layer 203 may be planarized with the dummy stacks 115 and the first spacers 113 using, e.g., a planarization process such as chemical mechanical polishing process, although any suitable process may be utilized.

After the formation of the ILD layer 203, the materials of the dummy gate electrodes 111 and the dummy gate dielectric 109 of the dummy stacks 115 may be removed to provide openings 207 between the first spacers 113 and to expose the fins 107 within the channel regions of the semiconductor device 100. In an embodiment the dummy gate electrodes 111 and the dummy gate dielectric 109 may be removed using, e.g., one or more wet or dry etching processes that utilize etchants that are selective to the materials of the dummy gate electrodes 111 and the dummy gate dielectric 109 of the dummy stacks 115. However, any suitable removal process may be utilized. Once the dummy gate electrodes 111 and the dummy gate dielectrics 109 of the dummy stacks 115 have been removed, the openings 207 left behind may be used to form metal gate stack structures therein and are discussed in greater detail below.

Figure 3A:
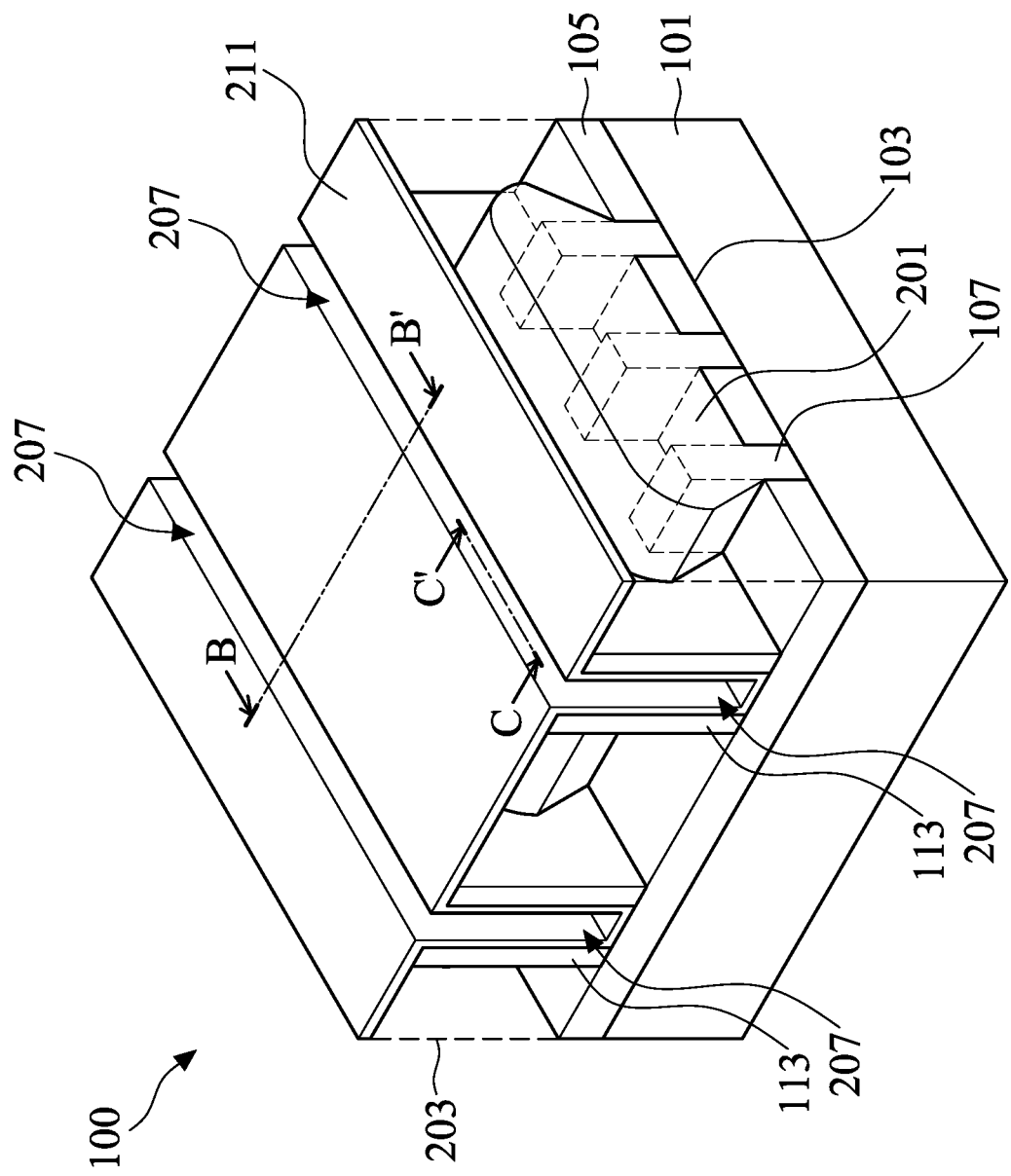

Turning to FIG. 3A, this figure illustrates the blanket deposition of a first dielectric layer 211 over the semiconductor device 100 once the dummy gate electrodes 111 and the dummy gate dielectrics 109 of the dummy stacks 115 have been removed. In some embodiments, the first dielectric layer 211 is deposited as an amorphous matrix layer using a high-k material (e.g., with a relative permittivity greater than about 5) such as hafnium oxide (HfO$_2$), zirconium oxide (ZrO$_2$), combinations thereof, or the like. According to some embodiments, the first dielectric layer 211 is deposited through a process such as atomic layer deposition (ALD), or the like to a thickness of between about 1 nm and about 3 nm, such as about 1.5 nm. Although, any suitable materials, any suitable deposition process, and any suitable thicknesses may be utilized for the first dielectric layer 211.

In an embodiment the atomic layer deposition process may be performed by utilizing a cyclic set of steps which may introduce a first precursor for use in a first self-limiting reaction, purge the first precursor, introduce a second precursor for use in a second self-limiting reaction, and purge the second precursor to complete a first cycle. Once the first cycle has been completed, the first cycle may be repeated for a second cycle, with each cycle depositing a monolayer of the desired material. For example, in an embodiment in which the first dielectric layer 211 is hafnium oxide, a first precursor such as hafnium chloride may be introduced and then purged, and a second precursor such as oxygen or ozone may be introduced to form a single monolayer of hafnium oxide.

Additionally, in some embodiments in which the atomic layer deposition process is utilized to form an initial crystallization instead of a completely amorphous material, the first dielectric layer 211 may be deposited using a high-temperature atomic layer deposition (ALD) at a temperature above about 300° C., such as about 350° C. for a period of between about 300 sec and about 1800 sec, such as about 600 sec. As such, the first dielectric layer 211 is deposited as a nano-crystalline film of the high-k material, the nano-crystalline film comprising a plurality of self-contained nano-crystallite regions suspended within an amorphous matrix layer of the high-k material. The nano-crystallite regions and the amorphous matrix layer are discussed in greater detail below.

Figure 3B:
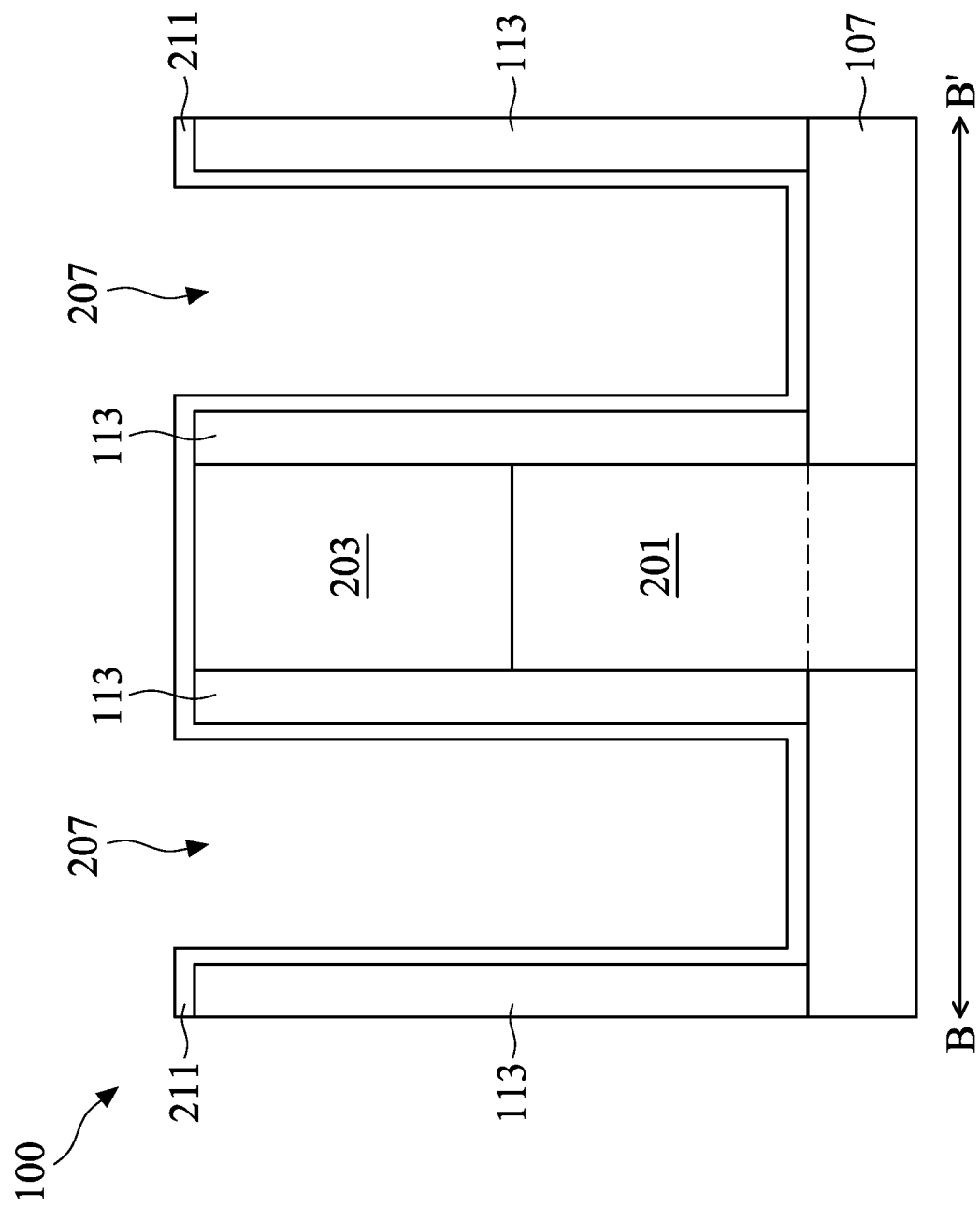

FIG. 3B illustrates a cross-sectional view of FIG. 3A along line B-B'. In particular, FIG. 3B illustrates the deposition of the first dielectric layer 211, wherein the first dielectric layer 211 is deposited over and conforms to the upper surfaces and sidewalls of the planarized first spacers 113, the exposed surfaces of the fins 107 in the channel regions of the semiconductor device at the bottom of the openings 207 formed between the first spacers 113 and the exposed surfaces of the ILD layer 203 over the source/drain regions 201 of the semiconductor device 100.

FIG. 3C illustrates a cross-sectional view of FIG. 3A along line C-C'. In particular, FIG. 3C illustrates the deposition of the first dielectric layer 211, wherein the first dielectric layer 211 is deposited over and conforms to the exposed surfaces of the fins 107 in the channel regions of the semiconductor device 100 formed between sidewalls of the first spacers 113 within the openings 207.

Figure 4:
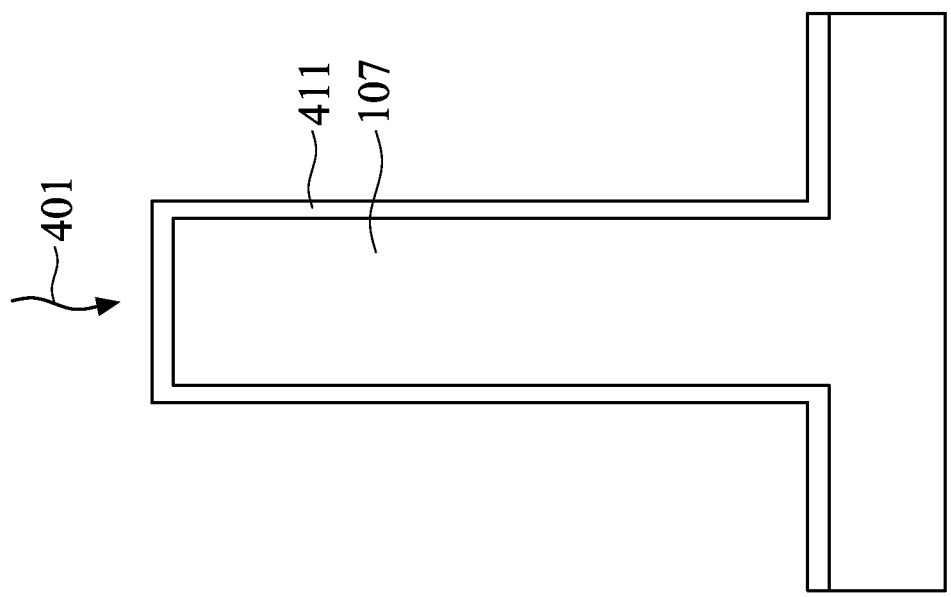
FIG. 4 illustrates an optional first anneal process in accordance with some embodiments.

FIG. 4 illustrates an optional post deposit anneal (PDA) process (represented in FIG. 4 by the arrow labeled 401) in accordance with some embodiments. For example, in embodiments in which the deposition process does not form an initial crystallization or else provides a minimal amount of crystallization, once the first dielectric layer 211 has been deposited, the optional PDA process may be performed to anneal the first dielectric layer 211 such that a plurality of nano-crystallite regions of a first type are formed within the amorphous matrix layer and/or to further crystallize any nano-crystallite regions of the first type previously formed within the amorphous matrix layer. As such, a simple nano-crystalline film 411 is formed from the first dielectric layer 211 and is disposed over the fin 107 of the channel regions of the semiconductor device 100. The nano-crystallite regions and the amorphous matrix layer are discussed in greater detail below.

In an embodiment, the optional post deposit anneal process (PDA) may be performed as a low-temperature soak anneal process at a temperature below about 700° C., such as about 500° C. for a period of between about 5 sec and about 1800 sec, such as about 300 sec. In other embodiments, the optional post deposit anneal process (PDA) may be performed as a high-temperature spike anneal process at a temperature above about 800° C., such as about 1100° C. for a period of less than about 100 ms, such as about 3 ms. In still other embodiments, the optional post deposit anneal (PDA) may be performed as a spike anneal process at a temperature of between about 700° C. and about 1000° C., such as about 850° C. for a period of greater than 0.5 sec, such as about 1.5 sec. However, any suitable temperatures and any suitable periods may be used to perform any of the low-temperature post deposit soak anneal process, the high-temperature post deposit spike anneal process, and the post deposit spike anneal process.

FIG. 5 illustrates a deposition process of a capping layer 501 over the semiconductor device 100. In some embodiments, the capping layer 501 may be formed over the first dielectric layer 211 of FIG. 2; and in some embodiments, the capping layer 501 may be formed over the nano-crystalline film 411 of the first type of FIG. 4. The capping layer 501 may be deposited as a single layer or as a multi-layer thin film using one or more materials including metals such as TiN, TaN, or W; amorphous silicon (e.g., a-Si); high-K dielectrics such as Al$_2$O$_3$, ZrO$_2$, and TiO$_2$; compounds thereof, or the like. The capping layer 501 may be deposited through a process such as atomic layer deposition (ALD), or the like to a thickness of between about 1 nm and about 50 nm, such as about 2 nm. Although any suitable material, any suitable deposition process, and any suitable thickness may be utilized for the capping layer 501.

Figure 6A:
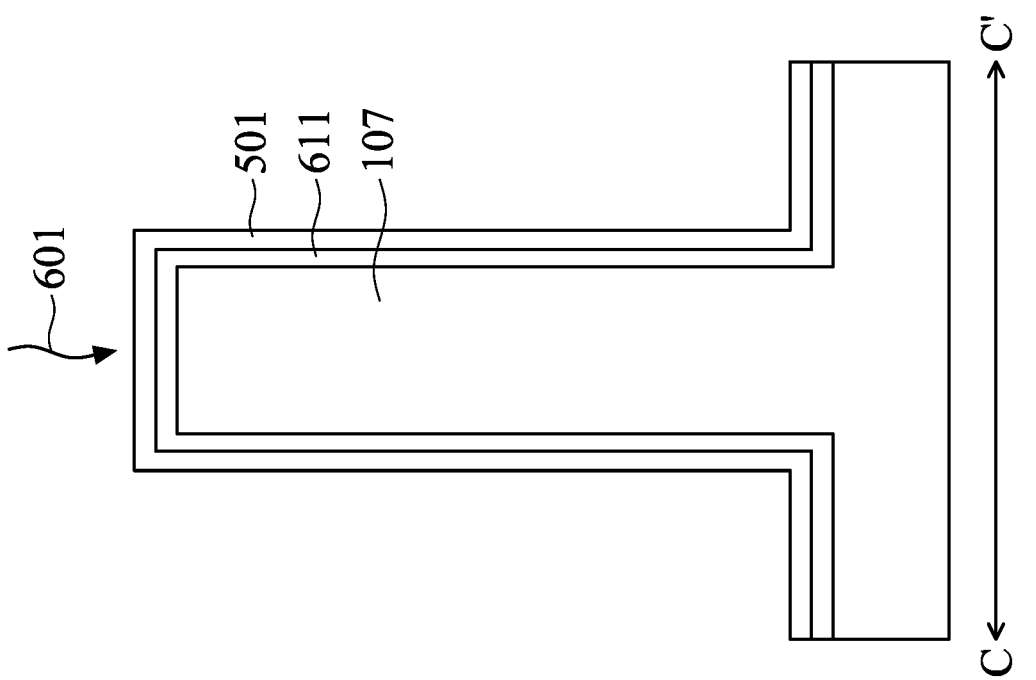
FIGS. 6A-6B illustrate, in two related views, an optional second anneal process in accordance with some embodiments.

FIG. 6A illustrates an optional post capping anneal (PCA) process (represented in FIG. 6A by the arrow labeled 601) in accordance with some embodiments. Based on the composition of the materials used to form the high-K dielectric material 211 and/or based on the composition of the materials used to form the capping layer 501, in some embodiments, the optional post capping anneal (PCA) process may be performed alone and apart from the post deposition anneal (PDA). In other embodiments, based on the composition of the materials used to form the high-K dielectric material 211 and/or based on the composition of the materials used to form the capping layer 501, the optional post capping anneal (PCA) process may be performed in combination with the PDA.

For example, according to some embodiments, after the capping layer has been deposited over the first dielectric layer 211, the optional post capping anneal PCA process may be used without the PDA process to initially anneal the first dielectric layer 211 and to initially form nano-crystallite regions of a first type within the amorphous matrix layer of the high-k material. As such, a simple nano-crystalline film 411 is formed from the first dielectric layer 211 and is disposed over the fin 107 of the channel regions.

In other embodiments, after the capping layer 501 has been deposited over the simple nano-crystalline film 411 formed for example via with the optional post deposit anneal (PDA) process, the optional post capping anneal PCA process may be used to further crystallize any nano-crystallite regions of a first type previously formed within the amorphous high-K material of the simple nano-crystalline film 411 and/or to initially form nano-crystallite regions of a second type within the amorphous high-K material. As such, a compound nano-crystalline film 611 is formed from the first dielectric layer 211 and is disposed over the fin 107 of the channel regions.

In an embodiment, the optional post metallization anneal (PMA) process and/or an optional post capping anneal (PCA) process may be performed as a spike anneal process at a temperature between about 700° C. and about 1000° C., such as about 850° C. for a period of greater than about 0.5 sec, such as about 1.5 sec. However, any suitable temperatures and any suitable periods may be used to perform the optional post metallization anneal (PMA) process and/or the optional post capping anneal (PCA) process.

Although embodiments disclosed herein are directed towards processes of deposition and anneal of high-k material films over channel regions of fins 107 of the semiconductor device 100, the deposition and anneal processes of the high-k material films may be used in other applications without departing from the spirit of the invention and are considered within scope of the embodiments disclosed herein. Furthermore, the examples provided herein and directed towards the high-k material films having a thicknesses of less than about 2.5 nm and with film compositions including materials such as $HfO_2$, other suitable regions, other semiconductor devices, other suitable thicknesses and other suitable materials may be used and are considered within scope of the embodiments disclosed herein. As such, the thermal budgets may vary according to film thicknesses and according to film compositions without departing from the spirit of the embodiments disclosed.

Figure 6B:
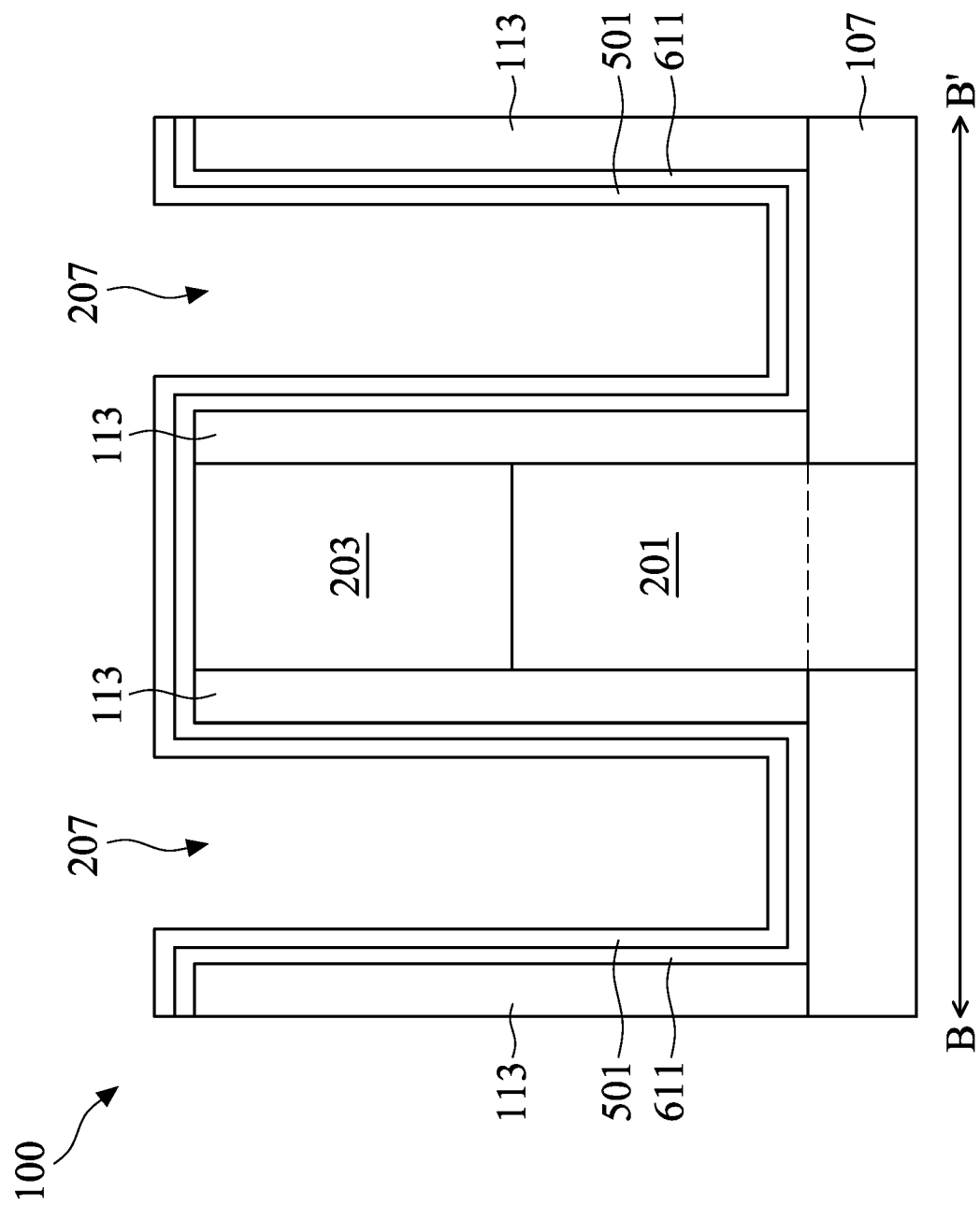

FIG. 6B illustrates the cross-sectional view of FIG. 3A along line B-B' after the deposit of the capping layer 501 and after the optional post capping anneal process illustrated in FIG. 6A. In particular, FIG. 6B illustrates the capping layer 501 being disposed over and conforming to the surfaces of the compound nano-crystalline film 611 of the semiconductor device 100. As such, the capping layer 501 conforms to the compound nano-crystalline film 611 disposed along sidewall surfaces of the upper surfaces and sidewalls of the planarized first spacers 113, disposed along the surfaces of the fins 107 in the channel regions at the bottom of the openings 207 and disposed along the surfaces of the ILD layer 203 over the source/drain regions 201.

Figure 7A:
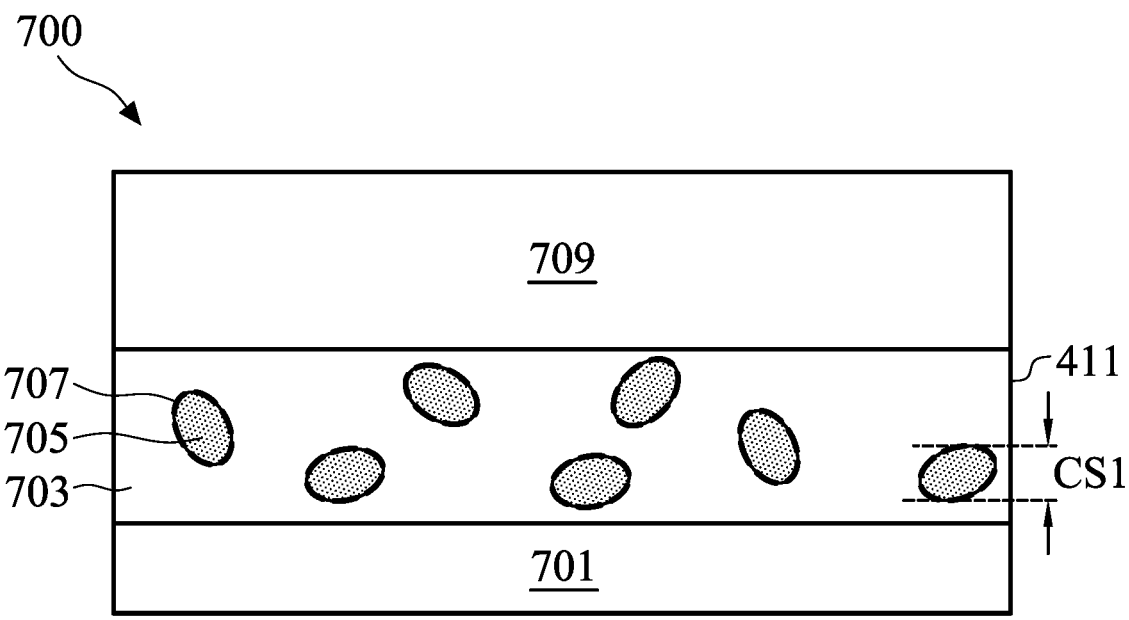
FIGS. 7A-7B illustrate formation of nano-crystalline high-k material layers, in accordance with some embodiments.

FIG. 7A illustrates in more detail the formation of the plurality of nano-crystallite regions 705 within, for example, the simple nano-crystalline film 411. FIG. 7A illustrates a portion of a layered stack of materials 700 including the simple nano-crystalline film 411 of a portion of the materials, for example, overlying the fin 107 in a channel region of the semiconductor device 100. In some embodiments, the layered stack of materials 700 comprises an interfacial layer 701 arranged between an upper surface of the fin 107 in the channel region of the semiconductor device and the simple nano-crystalline film 411. In other embodiments, the simple nano-crystalline film 411 may be disposed over and in contact with the upper surface of the fin 107.

In an embodiment the interfacial layer 701 may be a material such as silicon dioxide formed through a process such as in situ steam generation (ISSG). However, any suitable material or process of formation may be utilized.

The simple nano-crystalline film 411 may be formed from the first dielectric layer 211 and annealed using one or more of the deposition and annealing processes described above with regard to FIGS. 3A-3C and FIG. 4. According to some embodiments, the simple nano-crystalline film 411 is formed using one or more crystallization processes (e.g., HT-ALD, LT-PDA, HT-PDA, and/or PDA/PMA) as discussed in greater detail above. As such, the simple nano-crystalline film 411 is formed as a high-k dielectric layer comprising a plurality of nano-crystallite regions 705 suspended within an amorphous matrix layer 703.

FIG. 7A further illustrates that the nano-crystallite regions 705 are formed as a plurality of self-contained crystallized materials comprising coherence interfaces 707 including a plurality of crystalline/amorphous interfaces between the self-contained crystallized material of the nano-crystallite regions 705 and the amorphous material of the amorphous matrix layer 703. The amorphous material of the amorphous matrix layer 703 effectively separates grain boundaries of the nano-crystallite regions 705. As such, leakage paths and oxidant paths are minimized and/or altogether prevented from forming through the simple nano-crystalline film 411. Therefore, defects may be minimized and/or prevented during fabrication of the semiconductor device 100 resulting in greater yield, greater performance and increased reliability of the semiconductor device 100.

A crystallized area ratio of the simple nano-crystalline film 411 is defined as the percentage of the volume of the plurality of nano-crystallite regions 705 to the overall volume of the simple nano-crystalline film 411. According to some embodiments, the crystallized area ratio of the simple nano-crystalline film 411 may be between about 10% by volume and about 80% by volume, such as between about 30% by volume and about 50% by volume. The plurality of nano-crystallite regions 705 may be formed to have a crystallite size (CS1) (e.g., one or more cross-sectional diameters) of between about 0.5 nm and about 10 nm, such as about 3 nm. However, any suitable crystallized area ratio and any suitable crystallite size may be used.

Furthermore, the dielectric materials of the simple nano-crystalline film 411 may be doped or undoped. In some embodiments, the dielectric materials of the simple nano-crystalline film 411 may be doped with materials such as silicon (Si), lanthanum (La), yttrium (Y), nitrogen (N), scandium (Sc), gadolinium (Gd), combinations thereof, or the like. However, any other suitable dopants may be used. Based on the dopants utilized and/or based on the process controls (e.g., thickness, thermal budget, ramp up and ramp down rate of anneal) utilized, crystalline phases (e.g., tetragonal, cubic, orthorhombic, rhombohedral, and the like) of the nano-crystallite regions 705 can be modified. As such, physical properties of the simple nano-crystalline film 411 can be modified to provide higher-k values and/or to provide stronger ferroelectric properties as compared to the amorphous matrix layer 703 alone. Furthermore, these modified physical properties of the simple nano-crystalline film 411 may be maintained by controlling one or more of the phase boundary parameters including: the crystallized area ratio, the temperature, and/or doping induced phase separation to remain within morphotropic phase boundaries of the respective crystalline phases of the material of the simple nano-crystalline film 411.

For example, based on tetragonal and cubic phase modifications of the nano-crystallite regions 705, the simple nano-crystalline film 411 is provided increased high-k values or permittivity as compared to the amorphous matrix layer 703 alone. According to some embodiments, a tetragonal phase modification of the nano-crystallite regions 705 provides a permittivity of between about 25 and about 70, such as about 40 and a cubic phase modification of the nano-crystallite regions 705 provides a high-k value of between about 20 and about 40, such as about 30.

As another example, based on orthorhombic and rhombohedral phase modifications of the nano-crystallite regions 705, the simple nano-crystalline film 411 is provided increased ferroelectric properties such as polarization coercivity, polarization retentivity as compared to the amorphous matrix layer 703 alone. According to some embodiments, an orthorhombic phase modification of the nano-crystallite regions 705 provides a remnant polarization of between about 0.1 uC/cm$^2$ (micro-coulombs per centimeter squared) and about 15 uC/cm$^2$, such as about 0.5 uC/cm$^2$ and a rhombohedral phase modification of the nano-crystallite regions 705 provides a remnant polarization of between about 0.1 uC/cm$^2$ and about 15 uC/cm$^2$, such as about 0.5 uC/cm$^2$.

Figure 7B:
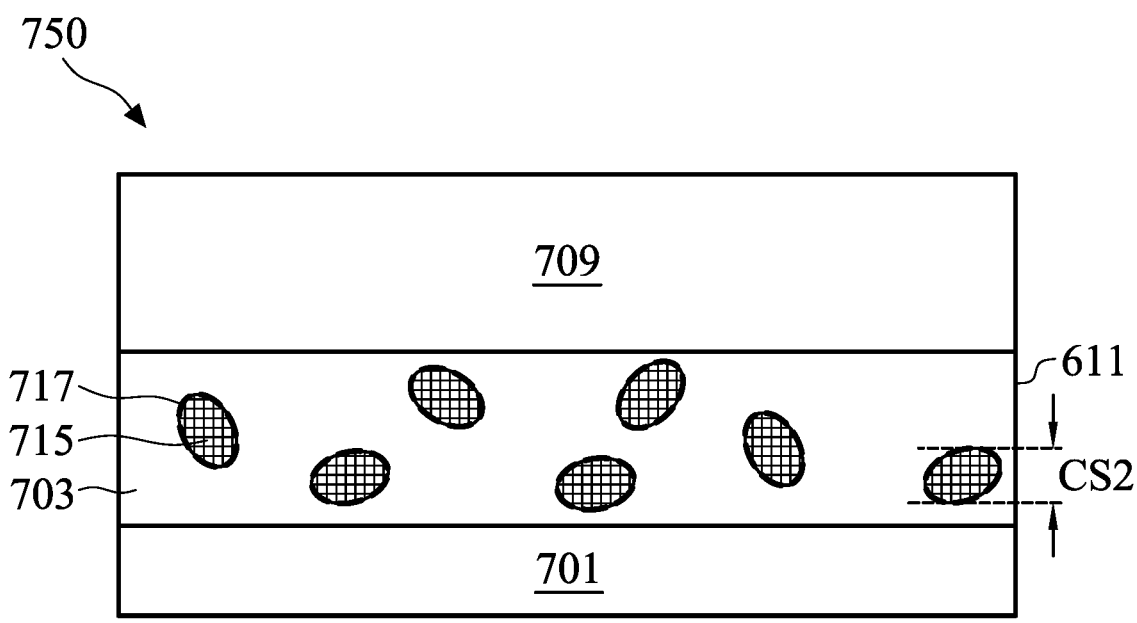

FIG. 7B illustrates in more detail the formation of a plurality of nano-crystallite regions 715 within, for example, the compound nano-crystalline film 611. FIG. 7B illustrates a portion of the layered stack of materials 750 including the compound nano-crystalline film 611 in the portion of the materials, for example, overlying the fin 107 in the channel region of the semiconductor device 100. In some embodiments, the layered stack of materials 750 comprises the interfacial layer 701 arranged between an upper surface of the fin 107 in the channel region of the semiconductor device and the compound nano-crystalline film 611. In other embodiments, the compound nano-crystalline film 611 may be disposed over and in contact with the upper surface of the fin 107.

The compound nano-crystalline film 611 may be formed as an amorphous high-k layer 211 and annealed using one or more of the deposition and annealing processes described above with regard to one or more of FIGS. 3A-3C, 4-5, and 6A-6B. According to some embodiments, the compound nano-crystalline film 611 is formed from one or more dielectric materials including HfO$_2$, ZrO$_2$, alloys thereof and the like and may be doped or undoped. However, any suitable materials may be utilized for the compound nano-crystalline film 611. In some embodiments, the dielectric materials of the compound nano-crystalline film 611 may be doped with one or more of the materials such as silicon (Si), lanthanum (La), yttrium (Y), nitrogen (N), scandium (Sc), gadolinium (Gd), combinations thereof, or the like. However, any other suitable dopants may be used. As such, the compound nano-crystalline film 611 comprises a plurality of compound nano-crystallite regions 715 formed within an amorphous matrix layer 703.

According to some embodiments, the compound nano-crystalline regions 715 may include the plurality of nano-crystallite regions 705 of FIG. 7A having been further processed. For example, the simple nano-crystalline film 411 of FIG. 7A may be subjected to a second annealing process (e.g., the post capping annealing (PCA) process). As such, the compound nano-crystalline regions 715, for example, may be crystallized to a greater extent to have a second crystallite size (CS2) (e.g., one or more cross-sectional diameters) that is greater than the first crystallite size (CS1). According to some embodiments, the second crystallite size (CS2) is between about 0.5 nm and about 10 nm, such as about 5 nm. However, any suitable crystallized area ratio and any suitable crystallite size may be used.

Additionally, in some embodiments in which dopants are implanted, the compound nano-crystalline regions 715 may have a different composition than the amorphous matrix layer 703. For example, in one embodiment the nano-crystallite regions 715 may have a dopant concentration with an atomic percentage (at. %) of between about 1 at. % and about 50 at. %, such as about 4 at. %, while the amorphous matrix layer 703 may have a smaller dopant concentration with an atomic percentage (at. %) of between about 0.1 at. % and about 10 at. %, such as about 0.4 at. %. However, any suitable concentration of dopants may be utilized.

A crystallized area ratio of the compound nano-crystalline film 611 is defined as the percentage of the volume of the plurality of nano-crystallite regions 715 to the overall volume of the compound nano-crystalline film 611. According to some embodiments, the crystallized area ratio of the compound nano-crystalline film 611 may be between about 10% by volume and about 80% by volume, such as between about 30% by volume and 50% by volume.

Figure 8A:
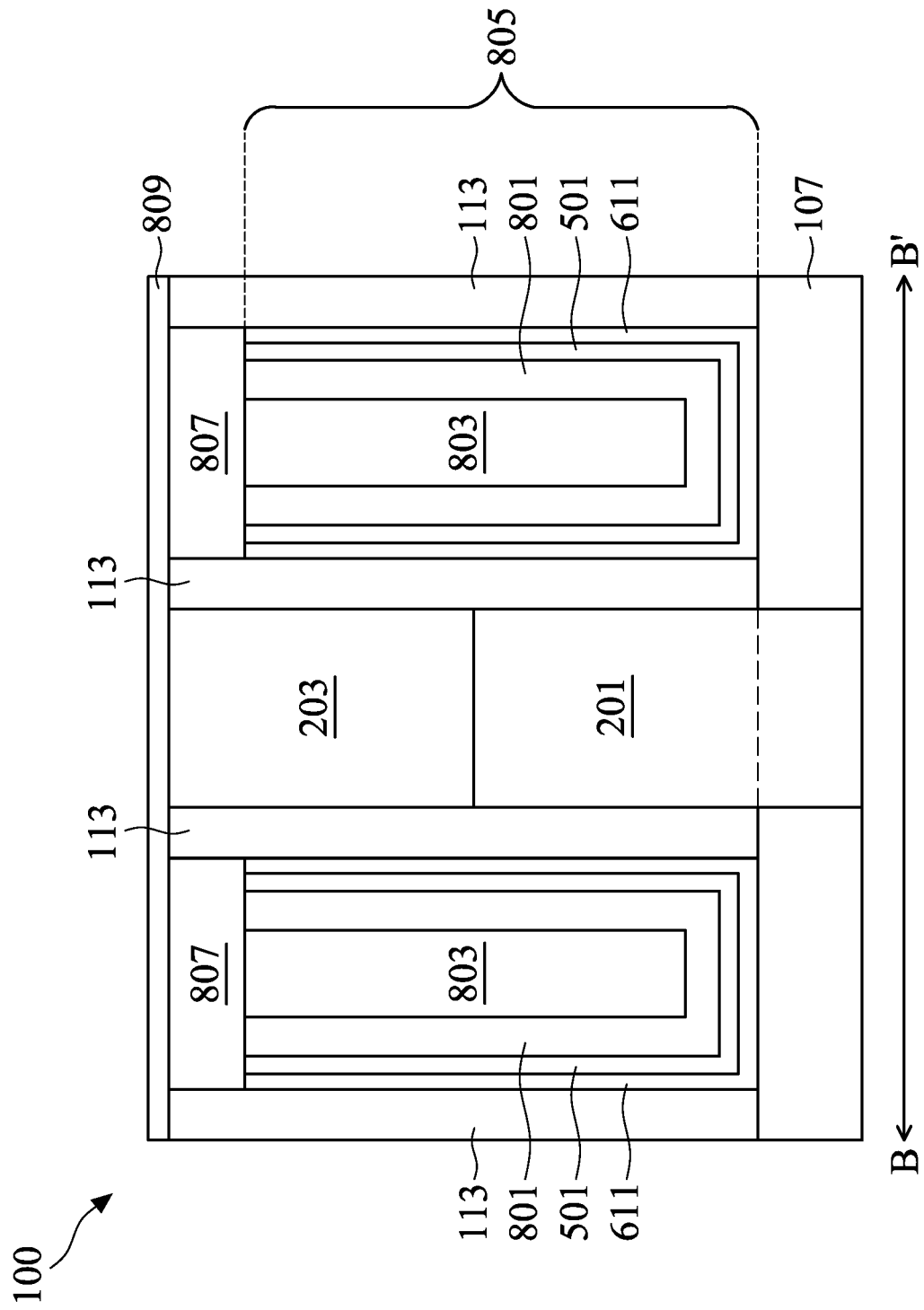
FIGS. 8A-8B illustrate, in two related views, the formation of gate electrode structures in accordance with some embodiments.
Figure 8B:
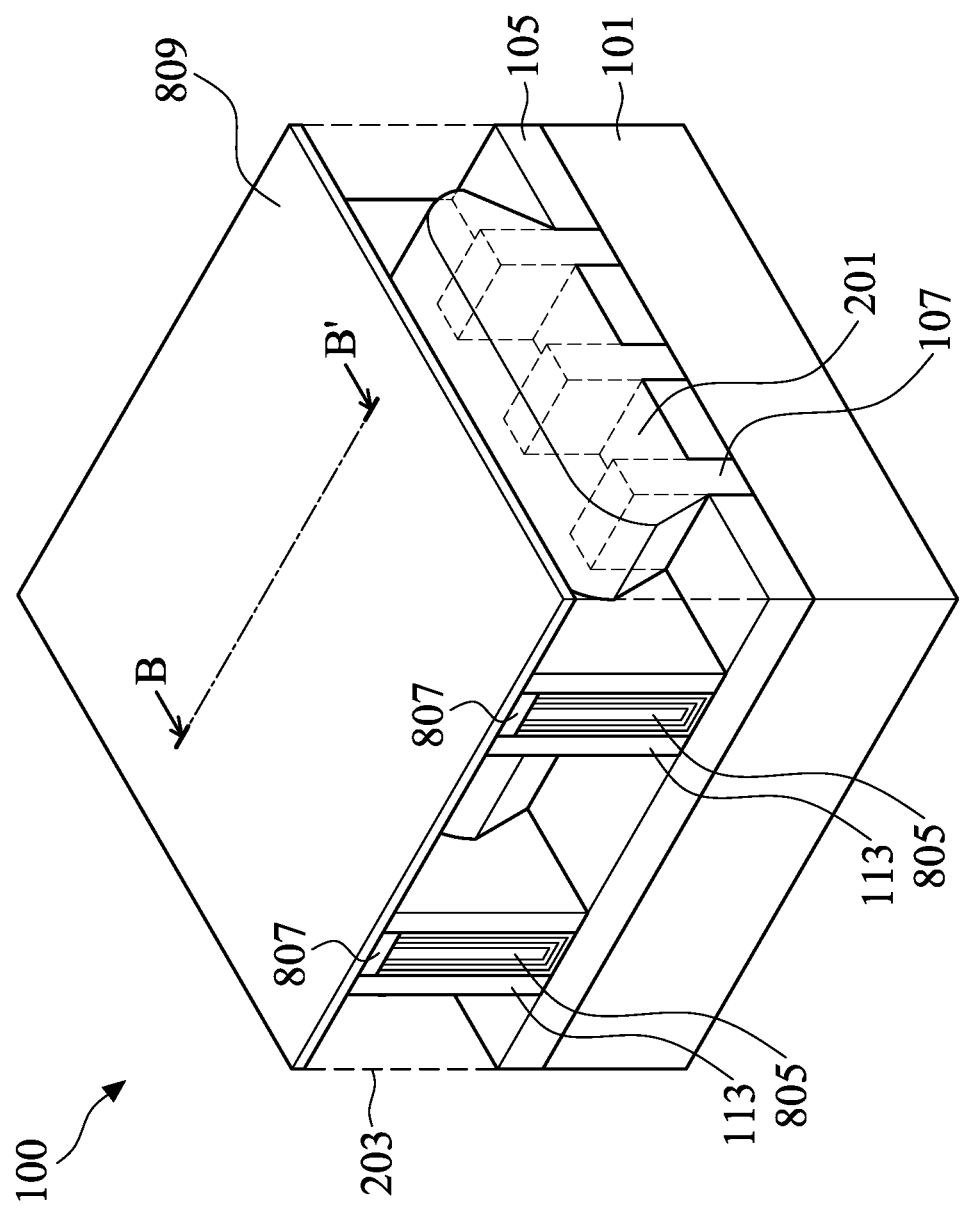

FIGS. 8A-8B illustrate, in two views, the formation of metal gate electrode structures in accordance with some embodiments. Once the capping layer 501 has been deposited as illustrated in FIG. 6B, a series of metal layers may be deposited over the capping layer 501. According to some embodiments, a first metal layer 801 may be formed adjacent to the capping layer 501 and may be formed from a first metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material of the first metal layer 801 may be deposited using a deposition process such as atomic layer deposition, chemical vapor deposition, sputtering, or the like, to a thickness of between about 5 Å and about 200 Å, although any suitable deposition process or thickness may be used.

In some embodiments, the first metal layer 801 may be a compound metal layer including a second metal material formed adjacent to the first metal material and, in a particular embodiment, may be similar to the first metal material. For example, the second metal material may be formed from a second metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material of the first metal layer 801 may be deposited using a deposition process such as atomic layer deposition, chemical vapor deposition, sputtering, or the like, to a thickness of between about 5 Å and about 200 Å, although any suitable deposition process or thickness may be used.

A third metal material 803 fills a remainder of the openings 207 left behind by the removal of the dummy gate electrodes 111. In an embodiment the third metal material 803 is a third metallic material such as W, Al, Cu, AlCu, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the openings 207 left behind by the removal of the dummy gate electrodes 111. In a particular embodiment, the third metal material 803 may be deposited to a thickness of between about 5 Å and about 500 Å, although any suitable material, deposition process, and thickness may be utilized.

Once the openings 207 left behind by the removal of the dummy gate electrodes 111 have been filled, gate stacks 805 may be formed from the materials filling the openings 207 by planarizing the materials in order to remove any excess material that is outside of the openings 207. In a particular embodiment the removal may be performed using a planarization process such as chemical mechanical polishing (CMP). However, any suitable planarization and removal process may be utilized.

After the materials of the gate stacks 805 have been formed and planarized, the materials of the gate stacks 805 may be recessed and capped with capping layers 807. In an embodiment the materials of the gate stacks 805 may be recessed using, e.g., a wet or dry etching process that utilizes etchants selective to the materials of the gate stacks 805. In an embodiment the materials of the gate stacks 805 may be recessed a distance of between about 5 nm and about 150 nm, such as about 120 nm. However, any suitable process and distance may be utilized.

Once the materials of the gate stacks 805 have been recessed, the capping layers 807 may be deposited and planarized with the first spacers 113. In an embodiment the capping layer 807 is a material such as SiN, SiON, SiCON, SiC, SiOC, combinations of these, or the like, deposited using a deposition process such as atomic layer deposition, chemical vapor deposition, sputtering, or the like. The capping layers 807 may be deposited to a thickness of between about 5 Å and about 200 Å, and then planarized using a planarization process such as chemical mechanical polishing such that the capping layers 807 are planar with the first spacers 113.

FIGS. 8A-8B additionally illustrate a formation of a first etch stop layer 809 over the gate stacks 805. In one embodiment, the first etch stop layer 809 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 809, such as low pressure CVD (LPCVD), PVD, or the like, could alternatively be used. The first etch stop layer 809 may be formed to a thickness of between about 5 Å and about 200 Å or between about 5 Å and about 50 Å.

FIG. 8B illustrates a perspective view of a semiconductor device 100 after deposition of the first etch stop layer 809. FIG. 8B further illustrates the cut line B-B' through which the cross-sectional view of FIG. 8A is illustrated.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, can be processed according to the above disclosure.

Furthermore, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

According to embodiments disclosed herein, the simple nano-crystalline film 411 and the compound nano-crystalline film 611 may be formed as dielectric layers of pure $HfO_2$, $ZrO_2$, and alloys thereof, including the plurality of self-contained nano-crystallite regions 705 suspended within the amorphous material of the amorphous matrix layer 703. These dielectric layers may be doped or undoped with one or more of: Si, La, Y, N, Sc, Gd, or the like and the crystal phases (e.g., tetragonal, cubic, orthorhombic, rhombohedral, and the like) of the nano-crystallite regions 705 may be modified during deposition and or during anneal. Based on the dopants and the process controls used the permittivity and/or the ferroelectric property (e.g., polarization coercivity, and/or polarization retentivity) of these high-k dielectric materials may be increased. Furthermore, these modifications may be maintained by controlling the process to stay within morphotropic phase boundaries of these high-k dielectric materials. As such, leakage paths and oxidant paths are minimized and/or altogether prevented from forming through the simple nano-crystalline film 411 and the compound nano-crystalline film 611. Therefore, defects may be minimized and/or prevented during fabrication of the semiconductor device 100 resulting in greater yield, greater performance and increased reliability of the semiconductor device 100.

In an embodiment, a method includes: depositing a dielectric layer over a fin in a channel region of a semiconductor device; annealing the dielectric layer a first time to form a plurality of nano-crystallite regions suspended within and separated by an amorphous matrix layer of the dielectric layer; and depositing a metal layer over the dielectric layer in the channel region of the semiconductor device. In an embodiment forming the plurality of nano-crystallite regions comprises doping the dielectric layer using a first dopant. In an embodiment forming the plurality of nano-crystallite regions further comprises maintaining a crystallized area ratio of the dielectric layer to be greater than or equal to 10% by volume and to be less than or equal to 80% by volume. In an embodiment the forming the plurality of nano-crystallite regions includes modifying a crystal phase of the plurality of nano-crystallite regions. In an embodiment the method further includes forming a capping layer over the dielectric layer. In an embodiment the annealing the dielectric layer is performed after the forming the capping layer. In an embodiment the method further includes annealing the dielectric layer a second time, wherein the annealing the dielectric layer the first time occurs prior to the forming the capping layer and wherein the annealing the dielectric layer the second time occurs subsequent to the forming the capping layer.

In an embodiment, a method includes: forming a gate dielectric layer of a fin-field effect transistor of a semiconductor device, the gate dielectric layer comprising a dielectric material; forming a plurality of self-contained crystal regions within the dielectric material of the gate dielectric layer, wherein the plurality of self-contained crystal regions comprise a plurality of crystalline/amorphous interfaces and wherein the plurality of self-contained crystal regions are separated from one another by dielectric material of an amorphous matrix layer of the gate dielectric layer; and depositing a metal gate structure over the gate dielectric layer of the fin-field effect transistor of the semiconductor device. In an embodiment the method further includes implanting a first dopant material in the dielectric material. In an embodiment the method further includes performing an anneal process to crystallize the dielectric material implanted with the first dopant material into a first plurality of self-contained crystal regions. In an embodiment the first dopant material is gadolinium. In an embodiment the method further includes: depositing a capping layer over the dielectric material; and performing a second anneal process subsequent to the depositing the capping layer, the second anneal process modifying a crystalline structure of the dielectric material. In an embodiment the dielectric material is hafnium oxide. In an embodiment the plurality of self-contained crystal regions have a first composition and the amorphous matrix layer has a second composition different from the first composition. In an embodiment the gate dielectric layer has a thickness no greater than 2.5 nm.

In an embodiment, a semiconductor device includes: a fin of a field effect transistor (finFET); a gate dielectric layer disposed over the fin, the gate dielectric layer including a plurality of self-contained nano-crystallite regions comprising a plurality of crystalline/amorphous interfaces, wherein the plurality of self-contained crystallite regions are separated from one another by an amorphous matrix dielectric material of the gate dielectric layer; and a metal gate electrode disposed over the gate dielectric layer. In an embodiment the gate dielectric layer is less than 2.5 nm. In an embodiment the semiconductor device further includes dopants located within the plurality of self-contained crystallite regions. In an embodiment a crystallized area ratio of the gate dielectric layer is greater than or equal to 10% by volume and is less than or equal to 80% by volume.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate dielectric layer over a channel region of a semiconductor fin, wherein the gate dielectric layer comprises nano-crystallite regions separated by an amorphous matrix material;
    performing a first anneal process to modify a first crystalline structure of the gate dielectric layer to a second crystalline structure, wherein after the first anneal process each of the nano-crystallite regions has a crystallite size with a first cross-sectional diameter;
    performing a second anneal process to modify the second crystalline structure of the gate dielectric layer to a third crystalline structure, wherein after the second anneal process each of the nano-crystallite regions has a crystallite size with a second cross-sectional diameter, wherein the second cross-sectional diameter is larger than the first cross-sectional diameter; and
    depositing a capping layer over the gate dielectric layer after the first anneal process and prior to the second anneal process.

2. The method of claim 1, wherein the second cross-sectional diameter is in a range from 0.5 nm to 10 nm.

3. The method of claim 1, further comprising implanting a first dopant in the gate dielectric layer before the second anneal process.

4. The method of claim 1, further comprising implanting a second dopant in the gate dielectric layer after the second anneal process, wherein after implanting the second dopant, a first dopant concentration of the nano-crystallite regions is different from a second dopant concentration of the amorphous matrix material.

5. The method of claim 4, wherein the first dopant concentration is higher than the second dopant concentration.

6. The method of claim 5, wherein the first dopant concentration is in a range from 1 percent to 5o percent and the second dopant concentration is in a range from 0.1 percent to 10 percent.

7. The method of claim 1, wherein a crystallized area ratio of the third crystalline structure of the gate dielectric layer is in a range from 10 percent by volume to 80 percent by volume.

8. The method of claim 1, wherein after performing the second anneal process a crystallized area ratio of the gate dielectric layer is in a range from 10 percent by volume to 80 percent by volume.

9. A method comprising:
    depositing a gate dielectric layer of a fin-field effect transistor, wherein the gate dielectric layer comprises a nano-crystalline film that includes a plurality of nano-crystallite regions suspended within and separated by an amorphous matrix layer;
    depositing a capping layer over the gate dielectric layer; and
    implanting a dopant in the gate dielectric layer, wherein after implanting the dopant a first dopant concentration of the plurality of nano-crystallite regions is higher than a second dopant concentration of the amorphous matrix layer.

10. The method of claim 9, wherein the plurality of nano-crystallite regions and the amorphous matrix layer comprise the same material.

11. The method of claim 9, further comprising:
    performing a first anneal process prior to depositing the capping layer to further crystallize the plurality of nano-crystallite regions, wherein after the first anneal process each of the plurality of nano-crystallite regions has a crystallite size having a first cross-sectional diameter.

12. The method of claim 11, further comprising:
    performing a second anneal process after depositing the capping layer, wherein after the second anneal process each of the plurality of nano-crystallite regions has a crystallite size having a second cross-sectional diameter, the second cross-sectional diameter being larger than the first cross-sectional diameter.

13. The method of claim 11, wherein after the first anneal process the plurality of nano-crystallite regions comprise a plurality of crystalline/amorphous interfaces, the plurality of crystalline/amorphous interfaces including coherence interfaces.

14. The method of claim 9, wherein implanting the dopant in the gate dielectric layer comprises doping the gate dielectric layer with lanthanum, gadolinium, scandium, or a combination thereof.

15. A semiconductor device, comprising:
    a fin protruding from a substrate;
    a gate dielectric layer over sidewalls and a top surface of the fin, wherein the gate dielectric layer comprises a plurality of nano-crystallite regions within an amorphous matrix layer, wherein the plurality of nano-crystallite regions and the amorphous matrix layer comprise a same material, and wherein a dopant concentration of the plurality of nano-crystallite regions is higher than a dopant concentration of the amorphous matrix layer;
    a capping layer over the gate dielectric layer; and
    a gate electrode over the capping layer.

16. The semiconductor device of claim 15, wherein the material of the plurality of nano-crystallite regions and the amorphous matrix layer has a relative permittivity that is greater than 5.

17. The semiconductor device of claim 15, wherein the dopant concentration of the plurality of nano-crystallite regions is in a range from 1 percent to 50 percent and the dopant concentration of the amorphous matrix layer is in a range from 0.1 percent to 10 percent.

18. The semiconductor device of claim 17, wherein dopants in the plurality of nano-crystallite regions and the amorphous matrix layer comprise lanthanum, gadolinium, scandium, or a combination thereof.

19. The semiconductor device of claim 15, wherein the gate dielectric layer has a crystallized area ratio that is in a range from 10 percent by volume to 80 percent by volume.

20. The semiconductor device of claim 15, wherein each of the plurality of nano-crystallite regions have a crystallite size that comprises at least one cross-sectional diameter that is in a range from 0.5 nm to 10 nm.

\* \* \* \* \*

UNITED STATES PATENT AND TRADEMARK OFFICE
CERTIFICATE OF CORRECTION

PATENT NO. : 11,710,665 B2
APPLICATION NO. : 17/403263
DATED : July 25, 2023
INVENTOR(S) : Chun-Yen Peng et al.

It is certified that error appears in the above-identified patent and that said Letters Patent is hereby corrected as shown below:

In the Claims

Claim 6, Column 16, Line 5; delete "5*0*" and insert --50--

Signed and Sealed this
Twenty-sixth Day of September, 2023

Katherine Kelly Vidal
*Director of the United States Patent and Trademark Office*